July 8, 1969 R. J. WIZENICK 3,454,774

ELECTRICAL CONNECTOR FOR SEMICONDUCTOR DEVICES

Filed Sept. 10, 1965 Sheet 1 of 2

RICHARD J. WIZENICK
INVENTOR.

BY Lyon & Lyon
ATTORNEYS

RICHARD J. WIZENICK
INVENTOR.

BY Lyon & Lyon
ATTORNEYS 3,454,774

ELECTRICAL CONNECTOR FOR SEMI-CONDUCTOR DEVICES

Richard J. Wizenick, Sierra Madre, Calif., assignor, by mesne assignments, to Globe-Union Inc., Milwaukee, Wis., a corporation of Delaware Filed Sept. 10, 1965, Ser. No. 486,399
Int. Cl. H01j *39/12, 5/02*
U.S. Cl. 250—220 20 Claims

ABSTRACT OF THE DISCLOSURE

An electrical connector for semiconductor devices, such as solar cells, composed of a thin and flexible electrically conductive sheet, preferably a metal having a coefficient of thermal expansion close to that of the semiconductor device. The sheet has one or more sections which have several apertures arranged so that there are no straight-line stress paths between the points where the semiconductor device is attached to the connector. Several semiconductor devices mounted to one or more connectors can be adhesively mounted on a panel in series or parallel.

The present invention relates to connectors and more particularly to connectors for semiconductor devices, such as solar cells.

Various semiconductor devices, such as solar cells, have certain characteristics which give rise to problems in electrically connecting them together and mounting them to a base. In the case of solar cells, for example, a flexible but somewhat rigid support must be provided for mounting and electrically interconnecting a plurality of cells while providing sufficient flexibility to withstand stresses resulting from thermal expansion of the cells and vibrations encountered thereby. A previous manner of mounting solar cells, which typically include a large area contact on one side and a contact strip on the other, included the use of a flexible glass epoxy material having one or move electrical conductors thereon soldered to the large area contact. The assembly thus formed was bonded with an adhesive to a suitable base.

Typical silicon solar cells have a low coefficient of thermal expansion of the order of 2 to 3 microinches per inch per degree centigrade; whereas typical epoxy glass materials have coefficients of thermal expansion of the order of 35 to 50 microinches per inch per degree centigrade. Because of the significant difference between the coefficients of thermal expansion of these two materials, undue stresses between the cells and connectors have been encountered. Additonally, in order to reduce the weight of the assembly, the back of a single cell typically is only soldered at several points resulting in a substantial air gap between the back of a cell and the epoxy glass material. Thus, the bond between the epoxy glass material and the back of the cell is dependent solely upon the solder connections during vibration and stress and, furthermore, heat transfer from the cell to the material (and thus to the base) is essentially only through the solder connections which are sometimes not sufficient to remove heat from the cell as rapidly as desired.

Accordingly, it is an object of the present invention to provide an improved connector and a method of using the same.

It is an additional object of the present invention to provide an improved connector for thin semiconductor devices, such as solar cells.

A further object of this invention is to provide a connector for a semiconductor device having no in-line metallic paths between points thereon which are affixed to the device.

A still further object of the present invention is to provide a connector for semiconductor devices having arcuate metallic paths between solder joints.

Another object of this invention is the provision of a lightweight flexible connector for semiconductor devices having good thermal expansion characteristics and which permits the formation of an improved bond between the devices and a base.

In accordance with an exemplary embodiment of the teachings of the present invention, a flexible but sufficiently rigid connector for semiconductor devices, such as solar cells, is provided. The connectors are formed from thin sheet metal and have a plurality of apertures therein for preventing direct stress paths, and for increasing the flexibility and reducing the weight thereof. One contact of the semiconductor device is soldered to points or areas on the connector which are not in a direct, or straight line path. The paths between the solder areas through the metallic connector are curved or arcuate. At least a substantial portion of the connector material preferably is of a metal having a coefficient of thermal expansion close to that of the semiconductor device. Molybdenum is particularly suitable for use in constructing connectors for silicon solor cells. Typically, a plurality of semiconductor devices are soldered to connectors as aforementioned, and then the connector side of the assembly is secured to a base by means of a suitable adhesive. The apertures in the connector further provide openings through which the adhesive may adhere directly to the semiconductor devices.

Other objects and features of this invention will become more apparent through a detailed consideration of the following description taken in conjunction with the accompanying drawings in which:

FIGURE 1 is a plan view of a connector utilizing the concepts of present invention;

FIGURES 2*a* and 2*b* are respectively an end elevation of the connector shown in FIGURE 1 and the end of a semiconductor device with which the connector may be joined;

Figures 1, 2A, 2B, 3:
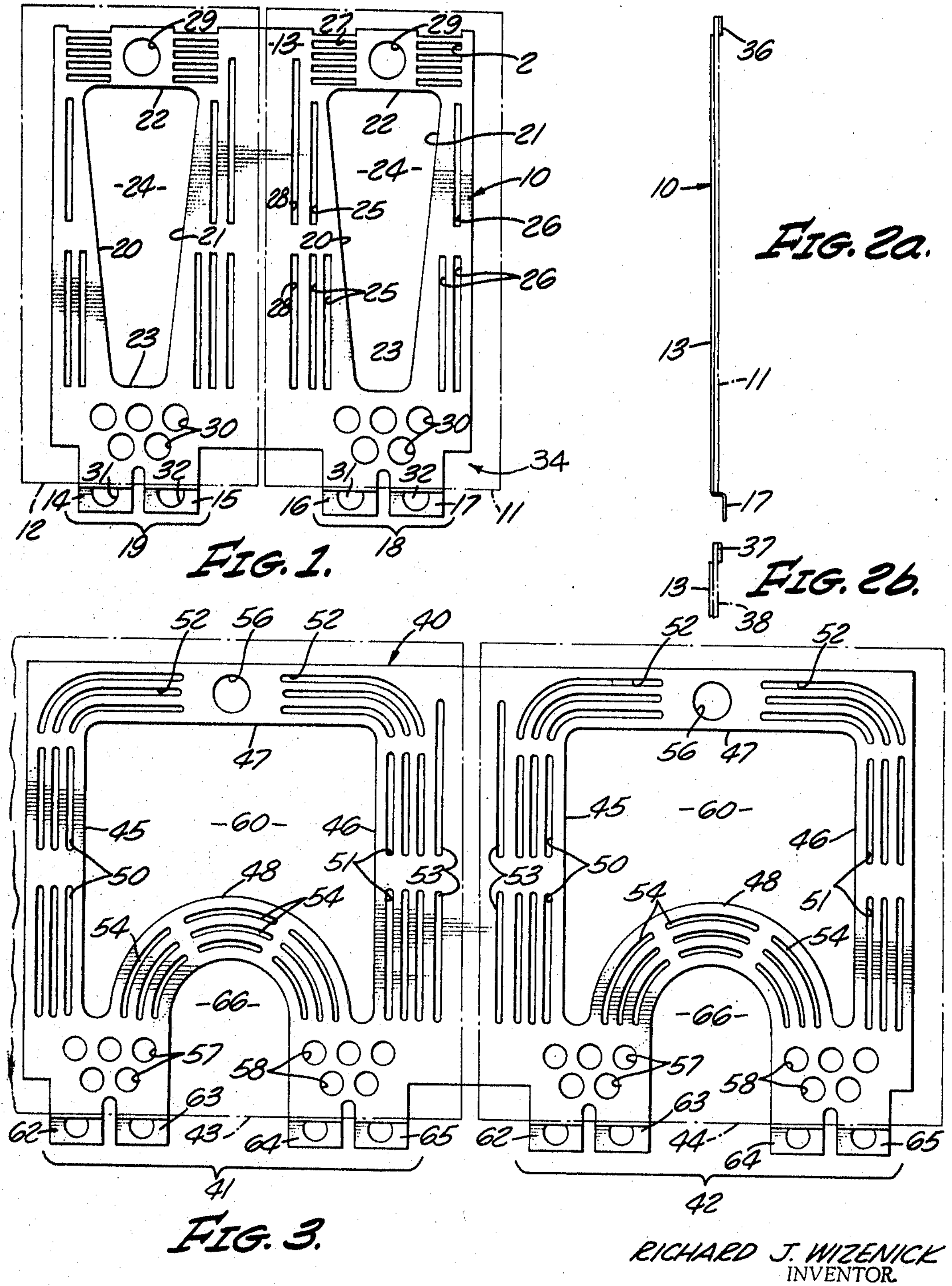
FIGURE 3 is a plan view of another connector utilizing the concepts of the present inveniton.

Inasmuch as the connectors of the present invention are particularly useful in mounting and connecting solar cells, the exemplary embodiments of these connectors will be discussed in connection with such cells. However, it will be appreciated that the connectors of the present invention are readily usable with other semiconductor devices and no limitation to solar cells is intended.

Solar cells are photovoltaic semiconductor devices having a P-N junction lying immediately beneath the upper surface of a semiconductor wafer, a large area contact formed on one of the regions of the wafer and a thin contact strip formed on the other region of the wafer. Typically, the large area contact will be on the bottom surface of the wafer, and the contact strip will be formed along one edge of the top surface. Such a device produces an electrical output in response to the impingement of radiation of certain wave lengths on its upper surface. In order to produce an electrical output sufficiently large enough to satisfy the requirements of many applications, it has been found necessary to mount large numbers of solar cells on a panel or base in selected electrical series and parallel relationships.

One common method of mounting these cells is to solder their bottom contact to the conductor of a printed circuit board (typically fashioned from an epoxy filled fiber glass base with a conductor thereon). A flexible metallic tab is positioned between the contact area of the cell and the board before soldering, the tab being of a length sufficient to extend outwardly beyond the end of the cell opposite to the end on which the upper contact strip is formed. A wire having a plurality of spaced, laterally displaced offset portions is then soldered to the aligned contact strips of all the cells lying in a row. The tabs extending outwardly from the cells of the adjoining row are then wrapped around the offset portions of the wire, crimped and soldered. Cell panels produced in this manner are subject to several factors which reduce their reliability, including breakage of the offset portions of the wire, short circuits caused by solder running down between cells from a tab and wire connection, and defective solder joints caused by heat transmitted by the wire and tab to previously soldered joints.

A mounting assembly which is substantially improved over the printed circuit board type mounting is discussed in copending U.S. patent application Ser. No. 352,102 filed Mar. 16, 1964, by Richard V. Keys, now U.S. Patent 3,378,407 which issued on Apr. 16, 1968, and assigned to the assignee of the present application, the disclosure thereof being incorporated herein by reference. In that patent, a plurality of cells are soldered to a conductive grid, and a bar of the same material from which the grid is made is soldered to the contact string of the cells. The cells then may be connected together by electrically connecting extensions of the grid of a group of cells to the bar of an adjacent group of cells.

Connectors according to the present invention are useful in connecting one cell to another, or in connecting one group of cells to another group. These connectors are characterized by various novel features including the capability to withstand stresses and vibration, a coefficient of thermal expansion substantially identical to, or close to, that of the solar cell, excellent adherence of the connector to the cell and the cell-connector assembly to a base or panel, low weight, ease of handling during assembly of a plurality of cells, and ease of inspection of solder connections.

Referring now to the drawings, and particularly to FIGURES 1 and 2, a connector, generally designated 10, constructed in accordance with the teachings of the present invention is illustrated. This connector 10 is suitable for mounting, spacing, and electrically connecting a pair of one centimeter by two centimeter solar cells 11 and 12. The connector 10 includes a generally flat portion or base 13 and a plurality of tabs 14 through 17. The connector 10 may be formed with a plurality of sections, generally designated by the reference numerals 18 and 19, to which the respective cells 11 and 12, illustrated by broken lines are connected. Typically, a single connector will include a plurality of sections, such as ten.

Each individual section 18 or 19 has a large aperture 24 bounded by side regions 20 and 21, and end regions 22 and 23. The side regions 20 and 21 and the end region 22 each have a plurality of slots 25, 26, and 27 respectively. One of the side regions of each section, e.g., side region 20 of section 18, further includes a guide slot 28 for facilitating a separation (as by cutting) of adjacent sections of the connector. Additionally, the end region 22 has a hole 29 therein, and the end region 23 has a plurality of holes 30. Each of the tabs 16 and 17 further include respective holes 31 and 32. The aperture 24, slots 25 through 28 and holes 29 through 32 in a connector are provided to prevent certain direct stress paths, further reduce the weight of the connector, increase its flexibility, and provide openings whereby adhesive may directly adhere to the bottom surface 34 of the solar cell 11. As can be seen from FIGURE 1, the section 19 of the connector 10 is constructed in a similar manner.

The bottom 34 of the solar cell 11 has an electrically conductive surface, which typically is a vacuum deposited metal contact layer to which the base of the connector section 18 is attached. According to a principal feature of the present invention, electrical contacts between the surface 34 of the solar cell 11 and the connector section 18 are made at points or areas on the connector section which are not in a direct, or straight-line, metallic path. This may be accomplished by rigidly electrically connecting the connector section 18 to the surface 34 of the cell 11 only in the general area of the holes 29 and 30. This electrical connection may be formed by placing thin solder disks between the section 18 in the area of the holes 29 and 30 and the surface 34 and applying sufficient heat to melt the solder and form a good electrical connection. Hence, there is no direct metallic or stress path between the solder joints, but only a curved or arcuate path through the side regions 20 and 21 and around the corners defined by the side region 20 and the end region 22, and the side region 21 and the end region 22. This particular arrangement facilitates flexure of the connector as the cell length changes as a result of thermal expansion and contraction thereof. In-line solder joints allow compression between the joints as the cell length changes because of temperature variations and this may even stress the connector along the stress path past its yield point, whereas, arcuate or loop-type paths between joints allow the connector to flex.

The connectors of the present invention are formed of a thin metal which preferably has a coefficient of thermal expansion substantially the same as that of the semiconductor device with which it will be used, and preferably it is non-magnetic or essentially so. A particularly suitable material is molybdenum which satisfies both these requirements. Another material which may be used is copper. A suitable connector may be made from a molybdenum sheet which is approximately 2 mils (0.002 inch) thick with a coating or plating, such as a 50 to 75 millionths of an inch plating of gold, of a material compatible with solder to provide a good solderable surface. A nickel "strike" (a very thin flash of nickel applied to the base material and heated in an inert atmosphere) may be applied to the molybdenum sheet before electroplating with gold to form a good bond between the sheet and the gold. Prior to the application of nickel and plating, the desired connector configuration is formed by using standard etched circuit board techniques. That is, art work for the desired configuration is prepared, a suitable photoresist is applied to the molybdenum sheet, and the desired material removed by "chemical milling" (etching). The connectors generally are formed in a sheet having a number of rows of connectors, with each row including a plurality of sections, such as ten.

A connector having a copper base may be formed from an approximately 3 mils thick copper sheet and coated with hot dipped tin about ½ mil thick. "Quarter hard" copper has been found to be suitable for the sheet and is sufficiently strong, yet soft enough to allow formation of the tabs 14 through 17. The particular connector configuration desired is formed in the sheet as described above prior to coating.

Typically, a connector 10 having a plurality of sections is provided for mounting and connecting a plurality of solar cells. The cells are laid or mounted in a fixture or jig, solder disks are applied to the conductive bottom or backing thereof, the connector is placed into position over the backing and disks, and the solder areas on the connector are heated to melt the solder disks. A fine tip soldering iron is suitable, or resistance soldering through the solder area, solder disk and cell may be employed.

Solar cells generally are used in panel form having a number of such cells interconnected in series and parallel arrangements. A connector 10 having a plurality of sections 18 and 19 (and more if desired) forms parallel connections between the conductive bottoms of the solar cells, and series connections are provided by soldering the tabs such as 16 and 17 in FIGURES 1 and 2*a*, to the conductive strip along the top edge of the next adjacent solar cell. FIGURE 2*a* illustrates a conductive strip 36 on the cell 11 and FIGURE 2*b* shows a similar conductive strip 37 on another cell 38. The tabs 16 and 17 are thus soldered to the strip 37. Inasmuch as the tabs are thin, they do not present easily broken projections above the top surface of the cell, and furthermore, generally lie below the top surface of cover glass mounted on the top surface of the cell.

A single solar cell may be connected as above described in series with another (or more) solar cell, or a group of parallel connected solar cells 11 and 12 mounted on a connector 10 may be connected in series with another similar group of solar cells by appropriately soldering the tabs 14, 15 and 16, 17 to the respective conductor strips of the adjacent group of solar cells. It should be pointed out that each section includes a pair of tabs 16 and 17 for redundancy, thus providing two connections between adjacent cells for providing greater reliability. The holes 29 through 32 provide windows through which the solder joints may be inspected (i.e., checked for proper connection and solder wetting).

After the cells have been appropriately soldered to one or more connectors, the assembly typically is mounted on a panel or base (such as aluminum) by means of an adhesive, such as silicone-rubber. According to another feature of the present invention, the apertures in the connector enable the adhesive to contact the surface 34 of the cell 11 and bond directly to this surface and to a suitable base (not shown). This arrangement provides a good mechanical bond between the cell and base and enables good heat transfer from the cell to the base. Inasmuch as a connector section is smaller than the surface 34 of the cell 11, the adhesive also can bond to the surface 34 around the sides of the connector. With the typical printed circuit board type connector, a substantial air gap exists between the upper surface of the printed circuit board and the bottom of the cell, with the bottom surface of the board being bonded to the base by the adhesive. With this prior art type construction, the mechanical connection between the board and cell is provided only through solder joints, and is a less satisfactory mechanical bond and has poor heat transfer characteristics.

Connections to external circuits may be provided directly to the tabs 14 through 17, or through a bus bar connected thereto. A suitable bus bar may be fashioned by cutting off the end regions 23 of the connector 10 along the lower ends of slots 25, 26 and 28.

FIGURE 3 illustrates a connector 40 having sections 41 and 42 for connecting respective cells 43 and 44, illustrated by broken lines. The section 41 includes, for example, side regions 45 and 46, an end region 47, and an arcuate or semicircular end region 48. As in the connector 10 illustrated in FIGURE 1, slots 50 and 51 are provided in respective side regions 45 and 46 and slots 52 are provided in the end region 47. The slots 52 additionally extend from the end region 47 around to the side regions 45 and 46. Guide slots 53 also are provided as a guide in separating adjacent sections of the connector 40. Slots 54 are formed in the end region 48. Holes 56 through 58 also are provided and define the areas at which the connector section is soldered to a cell 43. An aperture 60 is defined by the side regions 45 and 46, and the end regions 47 and 48. As in the case of the connector illustrated in FIGURE 1, it will be noted that no direct metallic path exists between the solder areas.

Suitable tabs 62 through 65 are provided for the section 41. An additional void 66 exists between the tabs 63 and 64, and the end region 48. The void 66 enables adhesive to bond to the bottom surface of the cell 43 in this area. The connector 40 may be cut along a line defined by the lower ends of the upper portions of the slots 50 and 51 to provide suitable connector sections for smaller cells, such as the one centimeter by two centimeter cells shown in FIGURE 1.

Figure 4:
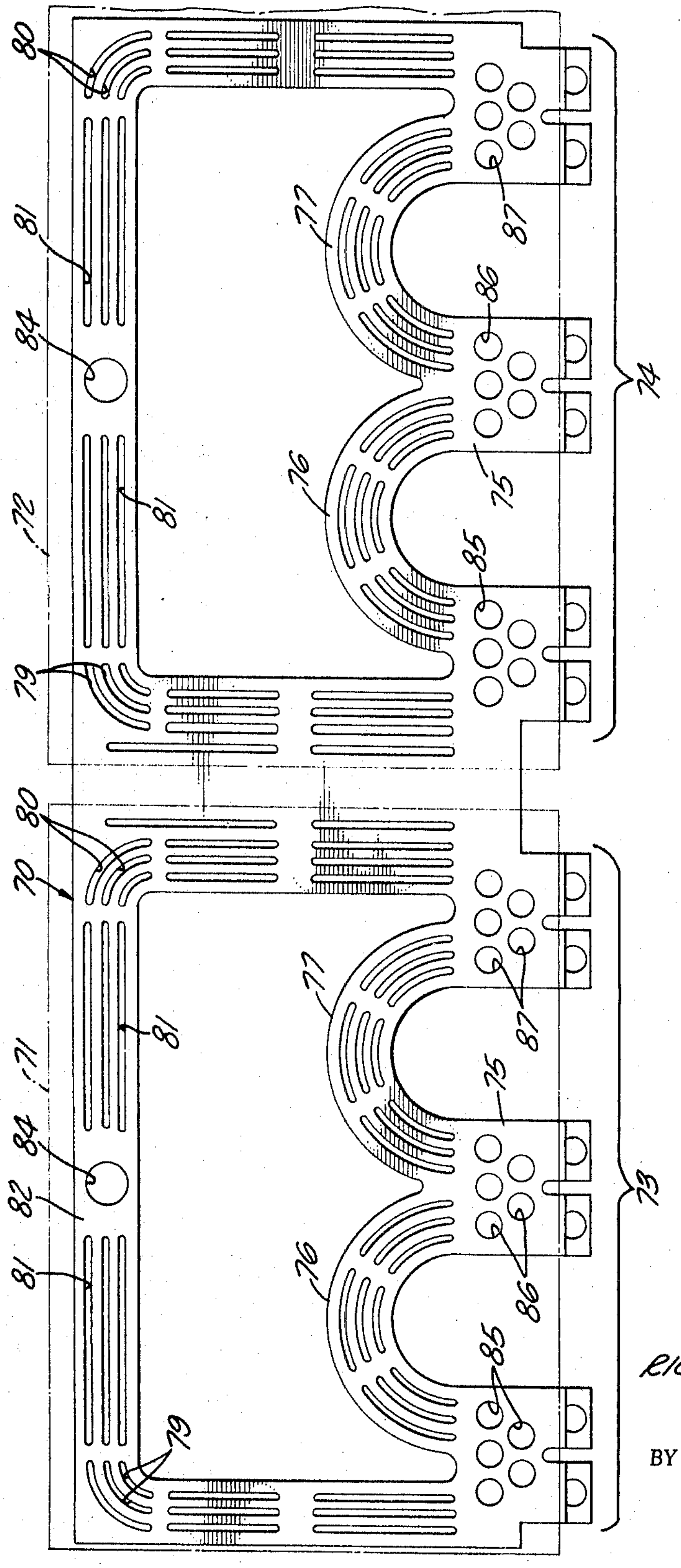
FIGURE 4 is a plan view of a further connector constructed in accordance with the teachings of the present invention.

A further embodiment of a connector 70, particularly adaptable for mounting three centimeter by two centimeter cells 71 and 72 (shown by broken lines), is illustrated in FIGURE 4. The configuration of each section 73 and 74 of the connector 70 is similar to that shown in FIGURE 3, but includes an end region 75 having arcuate areas 76 and 77. Additionally, arcuate slots 79 and 80 are provided in the upper corners and are separate from slots 81 formed in end region 82 of the section 73. Soldering areas are defined by holes 84 through 87. As with the connector configuration illustrated in FIGURES 1 and 3, no direct or straight line metallic path exists between the various solder joints.

Although particular connector configurations and materials have been described which have been found suitable for mounting and connecting solar cells and the like, other configurations and materials may be used. In selecting a desired configuration in accordance with the present invention, the apertures and the number and size of the slots in the connectors are chosen so as to provide the desired flexibility of the connectors while still maintaining only arcuate metallic paths between solder joints. The connector must be capable of deforming by flexure or otherwise to accommodate the physical changes in the device (such as a semiconductor) with which it is to be used. However, a sufficient structural strength must be provided for rigidity of the connector during the assembly of devices to the connector and inspection thereof, and for electrically connecting the devices and assemblies together. The holes provided at the solder joints not only aid in reducing th weight of the connector, but enable visual inspection for proper joints and solder wetting. The slots must not be so large as to substantially reduce the current carrying metallic area of the connector and thereby increase the resistance thereof. For example, it is preferable that the lower end of the lower guide slot 53 in FIGURE 3 does not extend below the lower ends of the lower slots 51 in the side region 46 in order to maintain sufficient current carrying metallic area between the sections 41 and 42, especially when the upper ends of these sections are cut off and the lower ends of these sections used for smaller cells or other devices.

Previously used printed circuit type board connectors have weighed approximately .182 gram per square inch. Copper and molybdenum connectors constructed in accordance with the teachings of the present invention have approximate respective weights of .150 gram per square inch and .110 gram per square inch.

It should be apparent that the present invention provides a novel connector for semicoductor devices, and the like, and provides an improved means of electrical connection to, and support for, the devices. Connectors constructed in accordance with the teachings of this invention do not include direct metallic paths between the electrical joints, provide sufficient flexibility and rigidity, allow superior bonds to be made, and are of light weight.

What is claimed is:

1. An electric connector comprising:

a thin and flexible electrically conductive sheet including at least one section, said section having a major central aperture and a plurality of minor apertures located about said motor aperture; and at least two electrical connection areas located in said section adjacent to said major aperture and arranged in direct line through said major aperture so that the path through said sheet between said connection areas is curved.

2. The electrical connector according to claim 1 wherein each of said connection areas include at least one hole arranged so that the path through said sheet between any hole of one connection area and any hole of another connection area is curved.

3. The electrical connector acording to laim 2 wherein said minor apertures are slots.

4. The electrical connector according to claim 2 wherein said sheet is molybdenum coated with gold.

5. The electrical connector according to claim 2 wherein said sheet is copper coated with tin.

6. The electrical connector according to claim 4 wherein said sheet has a thickness of about 2 mils.

7. The electrical connector according to claim 5 wherein said sheet has a thickness of about 3 mils.

8. An electrical connector comprising:

a thin and flexible electrically conductive sheet including at least one section, said section having side regions and first and second end regions which define a major central aperture and includea plurality of minor apertures therein;

a first electrical connection area is said first end region; said second end region including at least one arcuate portion having a plurality of minor apertures and defining plural legs with an aperture there between;

a plurality of electrical connection areas in said second end region interconnected by said legs; said first electrical connection area and said plurality of electrical connection areas being arranged so that the path through said sheet between any of said areas is curved.

9. The electrical connector according to claim 8 wherein said minor apertures are slots.

10. The electrical connector according to claim 9 wherein said electrical connection areas include at least one hole so that the path through said sheet between any hole of one connection area and any hole of another connection area is curved.

11. A connector for electrically connecting a plurality of semiconductor devices comprising a thin and flexible metal sheet including a respective plurality of sections, each of said sections having predetermined electrical connection areas thereon to which a device is connected, each of said sections having edges defining an aperture, and said edges forming curved paths through said sheet between said predetermined areas of a section, said areas of a section being arranged in a direct line through said aperture of each respective section.

12. A connector for electrically connecting a plurality of semiconductor devices comprising a thin and flexible metal sheet including a plurality of sections, each of said sections including a flat portion having predetermined electrical connection areas thereon to which a device is connected and a tab means for providing an electrical connection to another semiconductor device or an electrical circuit, each of said flat portions of the respective sections having edges defining an aperture, and said edges providing curved paths through said flat portion of said sheet between said areas of a section, said areas of a section being arranged in a direct line through said aperture of each respective section.

13. A connector for electrically connecting a plurality of semiconductor devices comprising a thin and flexible metal sheet including a plurality of sections, each of said sections having a flat portion with predetermined electrical connection areas thereon to which a first side of a semiconductor device is connected and tabs extending from said flat portion for providing electrical connections to a second side of another semiconductor device or an electrical circuit, each of said flat portions of the respective sections having edges defining an aperture, and said edges providing curved paths through said flat portion of said sheet between said areas of a section, said areas of a section being arranged in a direct line through said aperture of each respective section.

14. A connector for electrically connecting a plurality of semiconductor devices in a physically adjacent but spaced relationship comprising a thin and flexible metal sheet including a respective plurality of sections, each of said sections having predetermined electrical connection areas thereon to which a device is connected, each of said sections having edges defining a major aperture therein and including a plurality of minor apertures therein, said apertures enabling adhesive to bond to a device, and said edges forming curved paths through said sheet between said areas of a section, said areas of a section being arranged in a direct line through said major aperture of each respective section.

15. A method of electrically connecting a plurality of semiconductor devices each having a conductor on a side thereof to a thin and flexible metallic connector having apertures therein, and mounting the same on a base comprising the steps of positioning said devices adjacent each other in a spaced apart relationship, applying conductive metal to predetermined areas of the conductor of each device, positioning said connector over said devices and substantially aligning an aperture thereof with a central portion of each device, heating areas of said connector contiguous with said conductive metal to melt said metal, applying an adhesive layer to said connector and allowing the adhesive to pass through said apertures to contact said devices, and applying a base to said adhesive layer.

16. Apparatus comprising a solar cell having an electrical contact on one side, and a connector therefor, said connector comprising a thin and flexible metal sheet with predetermined electrical connection areas thereon, said sheet having edges defining an aperture, said edges providing curved paths through said sheet between said areas and said areas being arranged in a direct line through said aperture, and solder means electrically connecting and rigidly affixing said areas to said contact of said solar cell.

17. Apparatus comprising a solar cell having an electrical contact on one side, and a connector therefor, said connector comprising a thin and flexible metal sheet having a coefficient thermal expansion approximately the same as that of said solar cell, said metal sheet having predetermined electrical connection areas thereon, said sheet having edges defining an aperture, said edges providing curved paths through said sheet between said areas, said areas being arranged in a direct line through said aperture, and solder means electrically connecting and rigidly affixing said areas to said contact of said solar cell.

18. Apparatus comprising a plurality of solar cells each having an electrical contact on at least one side, and a connector therefor, said connector comprising a thin and flexible metal sheet including a plurality of sections, each of said sections having predetermined electrical connection areas thereon, each of said sections having edges defining an aperture, said edges providing curved paths through said sheet between said areas of each section, said areas of each section being arranged in a direct-line through the aperture of the respective section, and solder means electrically connecting and rigidly affixing the areas of each section to the contact of a respective solar cell.

19. Apparatus comprising a plurality of solar cells each having an electrical contact on one side, a connector therefor, and a base, said connector comprising a thin and flexible metal sheet including a plurality of sections, each of said sections having predetermined electrical connection areas thereon, each of said sections having edges defining at least a major aperture, said edges providing curved paths through said sheet between said areas of a section, said areas of a section being arranged in a direct line through said major aperture of the respective section, solder means electrically connecting and rigidly affixing the areas of each section to the contact of a respective solar cell thereby forming an assembly of electrically connected solar cells, and said assembly being bonded to said base with an adhesive, said adhesive extending through said major aperture of each section to the said one side of each respective solar cell.

20. Apparatus comprising a plurality of solar cells each having an electrical contact on one side, and a connector therefor, said connector comprising a thin and flexible metal sheet having a coefficient of thermal expansion approximately the same as said solar cells, said sheet including a plurality of sections with each of said sections having predetermined electrical connection areas thereon, each of said sections having edges defining an aperture, said edges providing curved paths through said sheet between said areas of a section, said areas of a section being arranged in a direct line through the aperture of the respective section, and solder means electrically connecting and rigidly affixing said areas of each section to the contact of a respective solar cell.

References Cited

UNITED STATES PATENTS

| | | | |
|---|---|---|---|
| 2,900,523 | 8/1959 | Ruzicka | 250—211 |
| 2,946,936 | 7/1960 | Geppert et al. | |
| 3,005,862 | 10/1961 | Escoffery | 136—89 |
| 3,028,499 | 4/1962 | Farrall | 250—212 X |
| 3,193,731 | 7/1965 | Gerlach et al. | 317—101 X |

JAMES W. LAWRENCE, *Primary Examiner.*

V. LAFRANCHI, *Assistant Examiner.*

U.S. Cl. X.R.

29—589, 630; 136—89; 250—212; 317—101, 234; 339—17